United States Patent
Lo

(10) Patent No.: US 8,982,915 B1
(45) Date of Patent: Mar. 17, 2015

(54) 8/10 AND 64/66 AGGREGATION

(71) Applicant: Marvell International Ltd., Hamilton (BM)

(72) Inventor: William Lo, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 108 days.

(21) Appl. No.: 13/899,877

(22) Filed: May 22, 2013

Related U.S. Application Data

(63) Continuation of application No. 13/563,342, filed on Jul. 31, 2012, now Pat. No. 8,451,869, which is a continuation of application No. 12/791,130, filed on Jun. 1, 2010, now Pat. No. 8,233,507, which is a continuation of application No. 11/415,937, filed on May 2, 2006, now Pat. No. 7,729,389.

(60) Provisional application No. 60/738,156, filed on Nov. 18, 2005.

(51) Int. Cl.
*H04J 3/04* (2006.01)
*H04L 25/14* (2006.01)
*H04B 1/04* (2006.01)
*H03M 9/00* (2006.01)

(52) U.S. Cl.
CPC ............ *H04L 25/14* (2013.01); *H04J 3/047* (2013.01); *H03M 9/00* (2013.01); *H04B 1/0483* (2013.01)
USPC .............................. 370/537; 370/391; 398/58

(58) Field of Classification Search
USPC .................................... 370/391, 537; 398/58
See application file for complete search history.

(56) References Cited

U.S. PATENT DOCUMENTS

| | | |
|---|---|---|
| 6,362,757 B1 | 3/2002 | Lee et al. |
| 6,430,201 B1 | 8/2002 | Azizoglu et al. |
| 6,476,737 B1 | 11/2002 | Caroselli et al. |
| 6,504,493 B1 | 1/2003 | Burd |
| 6,519,280 B1 | 2/2003 | Cole |
| 6,718,139 B1 | 4/2004 | Finan et al. |
| 6,813,651 B1 | 11/2004 | Smith et al. |

(Continued)

OTHER PUBLICATIONS

IEEE Std 802.3-2002 (Revisiion of IEEE 802.3, 2000 Edition); IEEE Standard for Information technology—Telecommunications and information exchange between systems—local and metropolitan area networks—Specific requirements Part 3: Carrier sense multiple access with collison detection (CSMA/CD) access method and physical layer specifications; Section One; IEEE Computer Society; Sponsored by the LAN/MAN Standards Committee; Mar. 8, 2002; 578 pages.

(Continued)

*Primary Examiner* — Hoon J Chung

(57) ABSTRACT

A network interface includes an interleaver module and line drivers. The interleaver module receives symbols on a plurality of input lanes. The symbols are arranged in groups, and each group includes one symbol from each of the plurality of input lanes. The symbols within each group are received concurrently on the plurality of input lanes. The interleaver module also serially outputs the symbols of a first group of the groups onto a first output lane of a plurality of output lanes, serially outputs the symbols of a second group of the groups onto a second output lane of the plurality of output lanes, and serially outputs the symbols of a third group of the groups onto the first output lane. The line drivers drive data based on the plurality of output lanes onto respective lanes of a physical medium.

20 Claims, 15 Drawing Sheets

(56) References Cited

U.S. PATENT DOCUMENTS

| | | |
|---|---|---|
| 6,823,483 B1 | 11/2004 | Creigh |
| 7,089,485 B2 | 8/2006 | Azadet et al. |
| 7,251,699 B1 | 7/2007 | Lo |
| 7,339,995 B2 | 3/2008 | Renaud et al. |
| 7,373,454 B1 | 5/2008 | Noe |
| 7,627,023 B1 | 12/2009 | Lo |
| 2001/0034729 A1 | 10/2001 | Azadet et al. |
| 2002/0080829 A1 | 6/2002 | Ofek et al. |
| 2002/0138675 A1 | 9/2002 | Mann |
| 2003/0002474 A1* | 1/2003 | Alexander et al. ............ 370/351 |
| 2003/0147654 A1 | 8/2003 | Sung et al. |
| 2003/0187994 A1 | 10/2003 | Jackson et al. |
| 2004/0022238 A1 | 2/2004 | Kimmitt |
| 2004/0156314 A1 | 8/2004 | Lund et al. |
| 2005/0102419 A1 | 5/2005 | Popescu et al. |
| 2005/0111532 A1 | 5/2005 | Creigh |
| 2006/0209735 A1 | 9/2006 | Evoy |
| 2007/0047572 A1 | 3/2007 | Desai et al. |
| 2008/0215777 A1 | 9/2008 | Richenstein et al. |

OTHER PUBLICATIONS

IEEE Std 802.3-2002 (Revisiion of IEEE 802.3, 2000 Edition); IEEE Standard for Information technology—Telecommunications and information exchange between systems—local and metropolitan area networks—Specific requirements Part 3: Carrier sense multiple access with collison detection (CSMA/CD) access method and physical layer specifications; Section Two; IEEE Computer Society; Sponsored by the LAN/MAN Standards Committee; Mar. 8, 2002; 581 pages.

IEEE Std 802.3-2002 (Revisiion of IEEE 802.3, 2000 Edition); IEEE Standard for Information technology—Telecommunications and information exchange between systems—local and metropolitan area networks—Specific requirements Part 3: Carrier sense multiple access with collison detection (CSMA/CD) access method and physical layer specifications; Section Three; IEEE Computer Society; Sponsored by the LAN/MAN Standards Committee; Mar. 8, 2002; 379 pages.

* cited by examiner

| Input Data | | Block Payload | | | | | | | | |
|---|---|---|---|---|---|---|---|---|---|---|
| | SYNC 0 1 2 | Bit Position | | | | | | | | 65 |
| Data Block Format: | | $D_0$ | $D_1$ | $D_2$ | $D_3$ | $D_4$ | $D_5$ | $D_6$ | $D_7$ | |
| $D_0D_1D_2D_3/D_4D_5D_6D_7$ | 01 | | | | | | | | | |
| Control Block Formats: | | Block Type Field | | | | | | | | |
| $C_0C_1C_2C_3/C_4C_5C_6C_7$ | 10 | 0x1e | $C_0$ | $C_1$ | $C_2$ | $C_3$ | $C_4$ | $C_5$ | $C_6$ | $C_7$ |
| $C_0C_1C_2C_3/O_4D_5D_6D_7$ | 10 | 0x2d | $C_0$ | $C_1$ | $C_2$ | $C_3$ | $O_4$ | $D_5$ | $D_6$ | $D_7$ |
| $C_0C_1C_2C_3/S_4D_5D_6D_7$ | 10 | 0x33 | $C_0$ | $C_1$ | $C_2$ | $C_3$ | | $D_5$ | $D_6$ | $D_7$ |
| $O_0D_1D_2D_3/S_4D_5D_6D_7$ | 10 | 0x66 | $O_0$ | $D_1$ | $D_2$ | $D_3$ | | $D_5$ | $D_6$ | $D_7$ |
| $O_0D_1D_2D_3/O_4D_5D_6D_7$ | 10 | 0x55 | $O_0$ | $D_1$ | $D_2$ | $D_3$ | $O_4$ | $D_5$ | $D_6$ | $D_7$ |
| $S_0D_1D_2D_3/D_4D_5D_6D_7$ | 10 | 0x78 | | $D_1$ | $D_2$ | $D_3$ | $D_4$ | $D_5$ | $D_6$ | $D_7$ |
| $O_0D_1D_2D_3/C_4C_5C_6C_7$ | 10 | 0x4b | $O_0$ | $D_1$ | $D_2$ | $D_3$ | $C_4$ | $C_5$ | $C_6$ | $C_7$ |
| $T_0C_1C_2C_3/C_4C_5C_6C_7$ | 10 | 0x87 | | $C_1$ | $C_2$ | $C_3$ | $C_4$ | $C_5$ | $C_6$ | $C_7$ |
| $D_0T_1C_2C_3/C_4C_5C_6C_7$ | 10 | 0x99 | $D_0$ | | $C_2$ | $C_3$ | $C_4$ | $C_5$ | $C_6$ | $C_7$ |
| $D_0D_1T_2C_3/C_4C_5C_6C_7$ | 10 | 0xaa | $D_0$ | $D_1$ | | $C_3$ | $C_4$ | $C_5$ | $C_6$ | $C_7$ |
| $D_0D_1D_2T_3/C_4C_5C_6C_7$ | 10 | 0xb4 | $D_0$ | $D_1$ | $D_2$ | | $C_4$ | $C_5$ | $C_6$ | $C_7$ |
| $D_0D_1D_2D_3/T_4C_5C_6C_7$ | 10 | 0xcc | $D_0$ | $D_1$ | $D_2$ | $D_3$ | | $C_5$ | $C_6$ | $C_7$ |
| $D_0D_1D_2D_3/D_4T_5C_6C_7$ | 10 | 0xd2 | $D_0$ | $D_1$ | $D_2$ | $D_3$ | $D_4$ | | $C_6$ | $C_7$ |
| $D_0D_1D_2D_3/D_4D_5T_6C_7$ | 10 | 0xe1 | $D_0$ | $D_1$ | $D_2$ | $D_3$ | $D_4$ | $D_5$ | | $C_7$ |
| $D_0D_1D_2D_3/D_4D_5D_6T_7$ | 10 | 0xff | $D_0$ | $D_1$ | $D_2$ | $D_3$ | $D_4$ | $D_5$ | $D_6$ | |

FIG. 5
Prior Art

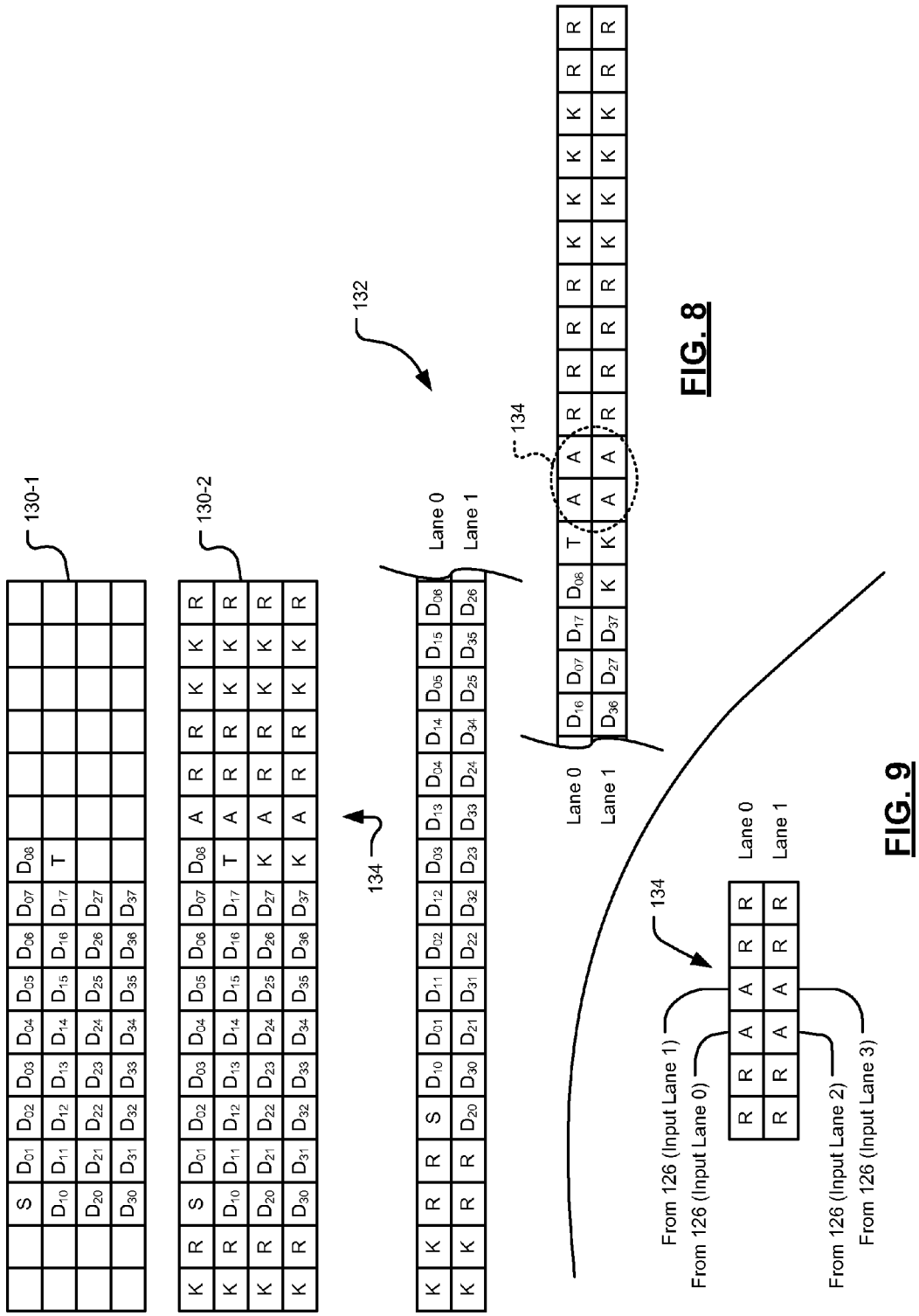

| Control Character | Notation | XGMII Control Code | 10GBASE-R Control Code | O-Code | 8B/10B Code | 20GBASE-R Usage |
|---|---|---|---|---|---|---|
| idle | /I/ | 0x07 | 0x00 | | K28.0 or K28.2 or K28.5 | Not Used |
| start | /S/ | 0xfb | Encoded by block type field | | K27.7 | No Change |
| terminate | /T/ | 0xfd | Encoded by block type field | | K28.7 | No Change |
| error | /E/ | 0xfe | 0x1e | | K30.7 | No Change |
| Sequence ordered_set | /Q/ | 0x9c | Encoded by block type field plus O code | 0x0 | K28.4 | No Change |
| reserved0 | /R/ | 0x1c | 0x2d | | K28.0 | Used for alignment |
| reserved1 | | 0x3c | 0x33 | | K28.1 | No Change |
| reserved2 | /A/ | 0x7c | 0x4b | | K28.3 | Used for alignment |
| reserved3 | /K/ | 0xbc | 0x55 | | K28.5 | Used for non-alignment idle |
| reserved4 | | 0xdc | 0x66 | | K28.6 | No Change |
| reserved5 | | 0xf7 | 0x78 | | K23.7 | No Change |
| Signal ordered_set | /Fsig/ | 0x5c | Encoded by block type field plus O code | 0xF | K28.2 | No Change |

FIG. 15

8/10 AND 64/66 AGGREGATION

CROSS-REFERENCE TO RELATED APPLICATIONS

This is a continuation of U.S. patent application Ser. No. 13/563,342, filed on Jul. 31, 2012, which is a continuation of U.S. patent application Ser. No. 12/791,130, filed on Jun. 1, 2010, now U.S. Pat. No. 8,233,507, which is a continuation of U.S. patent application Ser. No. 11/415,937, filed on May 2, 2006, now U.S. Pat. No. 7,729,389, which claims the benefit of U.S. Provisional Application No. 60/738,156, filed on Nov. 18, 2005. The entire disclosures of the above applications are incorporated herein by reference.

FIELD

The present invention relates to networks, and more particularly to data coding in physical coding sublayers of physical layer devices in Ethernet network devices.

BACKGROUND

Network interfaces include physical layer devices that transmit and receive data over a medium. In a 10 gigabit/second (10 Gb) network, the physical layer devices can include a physical coding sublayer (PCS) module that encodes, multiplexes, and synchronizes outgoing symbol streams. The PCS module also aligns, demultiplexes, and decodes incoming symbol streams. In one approach, the PCS module is implemented based on a 10 GBASE-X standard in the Institute of Electrical and Electronics Engineers (IEEE) 802.3 specification, which is hereby incorporated by reference in its entirety. The 10 GBASE-X standard provides for 4-lane to 4-lane aggregation through the PCS module and specifies an 8-bit to 10-bit (8/10) encoding pattern for each lane. In another approach, the PCS module is implemented based on a 10 GBASE-R standard in IEEE 802.3. The 10 GBASE-R standard provides for 4-lane to 1-lane aggregation and specifies a 64-bit to 66-bit (64/66) encoding pattern for the single lane of aggregated data. FIGS. 1-6 provide examples of PCS modules according to the 10 GBASE-X and 10 GBASE-R standards.

Referring now to FIG. 1, the International Organization for Standardization's ISO Open Systems Interconnection (OSI) model 10 includes a physical layer device 12 for transmitting and receiving data over a medium. The physical layer device 12 can employ different architectures for various types of physical media and bandwidth requirements.

Two example 10 Gb architectures are provided at 14-1 and 14-2. First 10 Gb architecture 14-1 is suitable for a single chip or system-on-chip (SOC) implementation of physical layer device 12. A reconciliation layer 16 provides a logical connection between a medium access controller (MAC) and other elements of the physical layer device 12. Reconciliation layer 16 communicates with a PCS module 20 via a 10 Gb media-independent interface (XGMII) 18. PCS module 20 communicates with a physical medium attachment unit (PMA) 22 that includes clock recovery and compensation logic for the incoming symbol streams. PCS module 20 communicates with a physical medium dependant (PMD) sublayer 24 that includes transmitters and receivers (transceivers). A media-dependent interface (MDI) 26 connects PMD 24 to a communication medium 28. MDI 26 can include various fiber-optic and copper connections to medium 28.

The second 10 Gb architecture 14-2 is suitable for use in applications that include chip-to-chip and/or backplane structures. In those architectures the physical layer device 12 is remotely located from the MAC and/or other higher network layers. An XGMII extender 29 allows XGMII 18 to communicate over greater distances. Extender 29 includes a pair of 10 Gb extended sublayer (XGXS) interface devices that connect to respective XGMII 18 interfaces of reconciliation layer 16 and PCS module 20. An extended attachment unit interface (XAUI) connects between the XGXS interface devices and provides 10 Gb communication through four lanes of communication.

Referring now to FIG. 2, a physical layer connection is shown between two network stations that employ the 10 GBASE-X standard. The stations include respective PCS module 20-1 and 20-2, referred to collectively as PCS modules 20. PCS module 20 communicates through medium 28, which includes four lanes.

First PCS module 20-1 receives data and idle symbols via four-lane XGMII 18. A substitutor module 30 replaces the idle symbols with specified control symbols and then outputs the data and control symbols onto four lanes 32-1, . . . , 32-4, referred to collectively as lanes 32. The control symbols include alignment symbols /A/, boundary symbols /K/, and disposable symbols /R/. The /K/ symbols represent boundaries of respective data groups. Substitutor module 30 periodically generates the /A/ symbols simultaneously on all lanes 32 with a pseudo-random period. The pseudo-random period satisfies minimum and maximum spacing specifications. Second PCS module 20-2 then uses each group of /A/ symbols to compensate for timing differences between the lanes 32. Substitutor module 30 also adds and deletes the disposable symbols /R/Customer from each lane 32 to compensate for frequency differences between XGMII 18 and lanes 32.

Each output of substitutor module 30 is eight bits wide. Each lane 32 includes an 8-to-10 bit converter 34 that converts the 8-bit data to the 10-bit format. Bit patterns in the 10-bit format are generated according to an algorithm that maximizes signal level switching across the medium 28. The signal level switching minimizes the risk of developing a DC offset in the medium 28. An output of each 8/10 bit converter 34 communicates with an input of a respective amplifier 36. Each amplifier 36 drives the 10-bit data onto a respective lane of medium 28. Amplifiers 38 communicate the 10-bit data to respective 8/10 bit converters 40 that restore the 8-bit data. The restored 8-bit data leaves respective 8/10 bit converters at different times, i.e. the restored 8-bit data is misaligned due to different propagation delays through each of lanes 32. Lane alignment module 42 realigns the data based on the /A/ symbols that were inserted by substitutor module 30 that are shown in FIG. 3. Lane alignment module 42 communicates the realigned data to an XGMII 18 of second PCS module 20-2.

Referring now to FIG. 3, first and second data diagrams 50-1, 50-2 show the four lanes of data into and out of substitutor module 30. In first data diagram 50-1 idle symbols are represented by blank fields 52. Data is represented by data fields 54 that include data $D_N$, where N represents a serial order of the respective data field. An /S/symbol in field 56 represents a start of the data. A /T/ symbol in field 58 represents a terminus of the data. A column of the simultaneously-inserted /A/ symbols appear at fields 60 and are used by lane alignment module 42.

Referring now FIG. 4, a physical layer connection is shown between two PCS modules 21 that employ the 10 GBASE-R standard. First PCS module 21-1 includes a 64/66 encoder 64 that aggregates the four lanes of XGMII 18 into one lane of data. A scrambler 66 prepares the data for transmission and ensures sufficient transition density. Data from the scrambler 66 is transmitted to a gearbox 68. Gearbox 68 formats data for a serializer/deserializer module (SerDes) 70. Gearbox 68 may include a FIFO buffer. SerDes 70 receives the data from gearbox 68 and transmits it through a single-lane medium 28. A second SerDes 72 receives the data from medium 28 and forwards it to second PCS module 21-2. Second PCS module 21-2 includes a gearbox 74, a descrambler 76, and a decoder 78, which implement the reverse of the transmit process.

Referring now to FIG. 5, a chart shows the formats of 66-bit data blocks that are allowed by 10 GBASE-R. Each 66-bit data block includes a 2-bit sync header 82 that is concatenated with a 64-bit block of data 84. Each 64-bit block of data 84 includes 8 bytes that may be data bytes 86 and/or control symbols 88. Bytes labeled with a C, O, S, or T represent control symbols 88. Bytes labeled with a D represent data bytes 86. A 2-bit sync header 82 with a value of $01_2$ indicates that the entire 64-bit block of data 84 is made up of data bytes 86. When the 2-bit sync header 82 has a value of $10_2$, at least one of the control symbols 88 exists among the 64-bit block of data 84.

Referring now to FIG. 6, a transmitter 90 for PCS module 21-1 is illustrated. XGMII 18 provides a data stream of 32-bit words. Encoder 64 processes two words at a time. Encoder 64 outputs an encoded data block 80 that includes sync header 82. Encoded data block 80 is transmitted to scrambler 66. Sync header 82 is used by a receiver to lock onto a data block. Sync header 82 bypasses scrambler 66. Both a scrambled data block and the sync header 82 are input to gearbox 68. Data from gearbox 68 is transmitted to SerDes 70. Scrambler 96 and gearbox 68 operate according to the 10 GBASE-R standard.

SUMMARY

A network interface includes N input lanes that receive data symbols and idle symbols. A substitutor module periodically replaces an idle symbol on each input lane with a corresponding alignment symbol to form an alignment group. M interleaver modules each interleave a portion of the data symbols and alignment symbols onto a corresponding transmit lane based on an interleaving pattern that provides each transmit lane with N/M alignment symbols from the alignment group. M is an integer greater than 1 and N is greater than M.

In other features the network interface includes encoders that each encode a corresponding one of the transmit lanes. M splitter modules deinterleave the data symbols and alignment symbols from corresponding transmit lanes. An alignment module receives the data symbols and alignment symbols from the M splitter modules and aligns the data symbols based on the alignment symbols and outputs the aligned data symbols to output lanes. The input lanes and the output lanes are equal in number. The network interface also includes decoders that decode corresponding ones of the transmit lanes and communicate corresponding lanes of decoded data symbols and alignment symbols to corresponding ones of the splitter modules.

A network interface includes N input lanes that receive data symbols and idle symbols. N is an integer greater than 1. A substitutor module periodically replaces successive idle symbols on each lane with alignment symbols to form corresponding alignment groups. An interleaver module interleaves the data symbols and alignment groups onto M transmit lanes according to an interleaving pattern that provides each transmit lane with one of the alignment groups, where M is an integer greater than 1 and N>M.

In other features encoders encode a corresponding one of the transmit lanes. A splitter module deinterleaves the data symbols and alignment groups, and an alignment module receives the data symbols and alignment groups from the splitter module and aligns the data symbols based on an arrival sequence of the alignment groups and outputs the aligned data symbols to output lanes. The input lanes and the output lanes are equal in number. Decoders decode corresponding ones of the transmit lanes and communicate corresponding lanes of decoded data symbols and alignment groups to the splitter module. The idle symbols include alignment idle symbols and each alignment group includes an alignment idle symbol and a marker symbol. The idle symbols include pairs of associated disposable idle and boundary symbols and the substitutor module deletes the disposable idle symbols and forms the alignment groups with the boundary symbols.

A method of providing a network interface includes receiving data symbols and idle symbols over N input lanes, periodically replacing an idle symbol on each input lane with a corresponding alignment symbol to form an alignment group, and interleaving the data symbols and alignment symbols onto M corresponding transmit lanes based on an interleaving pattern that provides each transmit lane with N/M alignment symbols from the alignment group. M is an integer greater than 1 and N is greater than M.

In other features the method includes encoding the transmit lanes. The method includes deinterleaving the data symbols and alignment symbols from corresponding ones of the transmit lanes, receiving the data symbols and alignment symbols from the deinterleaving step, aligning the data symbols based on the alignment symbols, and communicating the aligned data symbols to output lanes. The input lanes and the output lanes are equal in number. The method includes decoding corresponding ones of the transmit lanes and communicating corresponding lanes of decoded data symbols and alignment symbols to the deinterleaving step.

A method of providing a network interface includes receiving data symbols and idle symbols over N input lanes. N is an integer greater than 1. The method includes periodically replacing idle symbols on each lane with corresponding alignment symbols to form corresponding alignment groups, and interleaving the data symbols and alignment groups onto M transmit lanes according to an interleaving pattern that provides each transmit lane with one of the alignment groups. M is an integer greater than 1 and N>M.

In other features the method includes encoding corresponding one of the transmit lanes. The method includes deinterleaving the data symbols and alignment groups, aligning the data symbols based on an arrival sequence of the alignment groups, communicating the aligned data symbols onto output lanes. The input lanes and the output lanes are equal in number. The method also includes decoding corresponding ones of the transmit lanes and communicating corresponding lanes of decoded data symbols and alignment groups to the deinterleaving step. The idle symbols include alignment idle symbols and each alignment group includes an alignment idle symbol and a marker symbol. The idle symbols include pairs of associated disposable idle and boundary symbols and the substitutor module deletes the disposable idle symbols and forms the alignment groups with the boundary symbols.

A network interface includes N input lanes that receive data symbols and idle symbols, substitutor means for periodically replacing an idle symbol on each input lane with a corresponding alignment symbol to form an alignment group, and M interleaver means for interleaving corresponding portions of the data symbols and alignment symbols onto corresponding transmit lanes based on an interleaving pattern that provides each transmit lane with N/M alignment symbols from the alignment group. M is an integer greater than 1 and N is greater than M.

In other features the network interface includes encoder means for encoding corresponding ones of the transmit lanes. The network interface also includes M splitter means for deinterleaving the data symbols and alignment symbols from corresponding transmit lanes, and alignment means for receiving the data symbols and alignment symbols from the M splitter means, aligning the data symbols based on the alignment symbols, and communicating the aligned data symbols to output lanes. The input lanes and the output lanes are equal in number. The network interface includes decoder means for decoding the transmit lanes and communicating decoded data symbols and alignment symbols to the M splitter means.

A network interface includes N input lanes that receive data symbols and idle symbols, where N is an integer greater than 1, substitutor means for periodically replacing idle symbols on each lane with corresponding alignment symbols to form corresponding alignment groups, and interleaver means for interleaving the data symbols and alignment groups onto M transmit lanes according to an interleaving pattern that provides each transmit lane with one of the alignment groups. M is an integer greater than 1 and N>M.

In other features the network interface includes encoder means for encoding corresponding ones of the transmit lanes. The network interface includes splitter means for deinterleaving the data symbols and alignment groups, and alignment means for receiving the data symbols and alignment groups from the splitter means, aligning the data symbols based on an arrival sequence of the alignment groups, and communicating the aligned data symbols to output lanes. The input lanes and the output lanes are equal in number. The network interface includes decoder means for decoding corresponding ones of the transmit lanes and communicating corresponding lanes of decoded data symbols and alignment groups to the splitter means. The idle symbols include alignment idle symbols and each alignment group includes an alignment idle symbol and a marker symbol. The idle symbols include pairs of associated disposable idle and boundary symbols and the substitutor means deletes the disposable idle symbols and forms the alignment groups with the boundary symbols.

A computer program stored on a tangible computer medium, comprising providing a network interface is provided. The computer program includes receiving data symbols and idle symbols over N input lanes, periodically replacing an idle symbol on each input lane with a corresponding alignment symbol to form an alignment group, and interleaving the data symbols and alignment symbols onto M corresponding transmit lanes based on an interleaving pattern that provides each transmit lane with N/M alignment symbols from the alignment group. M is an integer greater than 1 and N is greater than M.

In other features the computer program includes encoding the transmit lanes. The computer program includes deinterleaving the data symbols and alignment symbols from corresponding ones of the transmit lanes, receiving the data symbols and alignment symbols from the deinterleaving step, aligning the data symbols based on the alignment symbols, and communicating the aligned data symbols to output lanes. The input lanes and the output lanes are equal in number. The computer program includes decoding corresponding ones of the transmit lanes and communicating corresponding lanes of decoded data symbols and alignment symbols to the deinterleaving step.

A computer program stored on a tangible computer medium, comprising providing a network interface is provided. The computer program includes receiving data symbols and idle symbols over N input lanes. N is an integer greater than 1. The computer program includes periodically replacing idle symbols on each lane with corresponding alignment symbols to form corresponding alignment groups, and interleaving the data symbols and alignment groups onto M transmit lanes according to an interleaving pattern that provides each transmit lane with one of the alignment groups. M is an integer greater than 1 and N>M.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 5 is a chart of the combinations of data and control symbols using 10 GBASE-R 64/66 bit encoding according to the prior art;

FIG. 8 is a data diagram of aggregated symbols for 20 GBASE-X communications;

FIG. 9 is a data diagram of a block of alignment symbols in the aggregated symbols;

FIGS. 13-14 are data diagrams of alignment symbols in lanes of aggregated symbols;

FIG. 15 is a table of symbol translations in a 20 GBASE-R PCS module;

DETAILED DESCRIPTION

Figure 1:
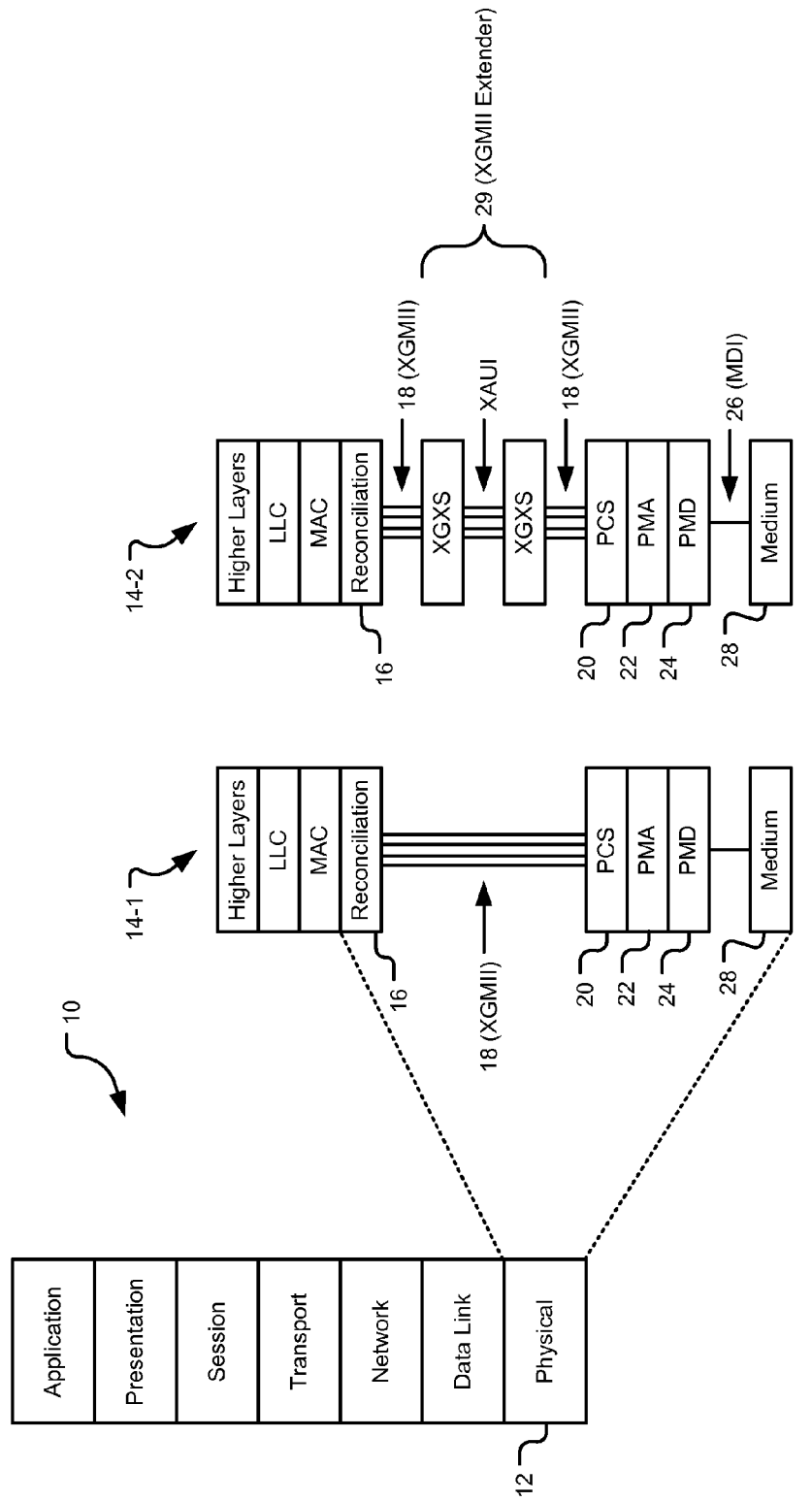
FIG. 1 is a functional block diagram of the OSI Model and sublayers in a physical layer device according to the prior art.
Figure 2:
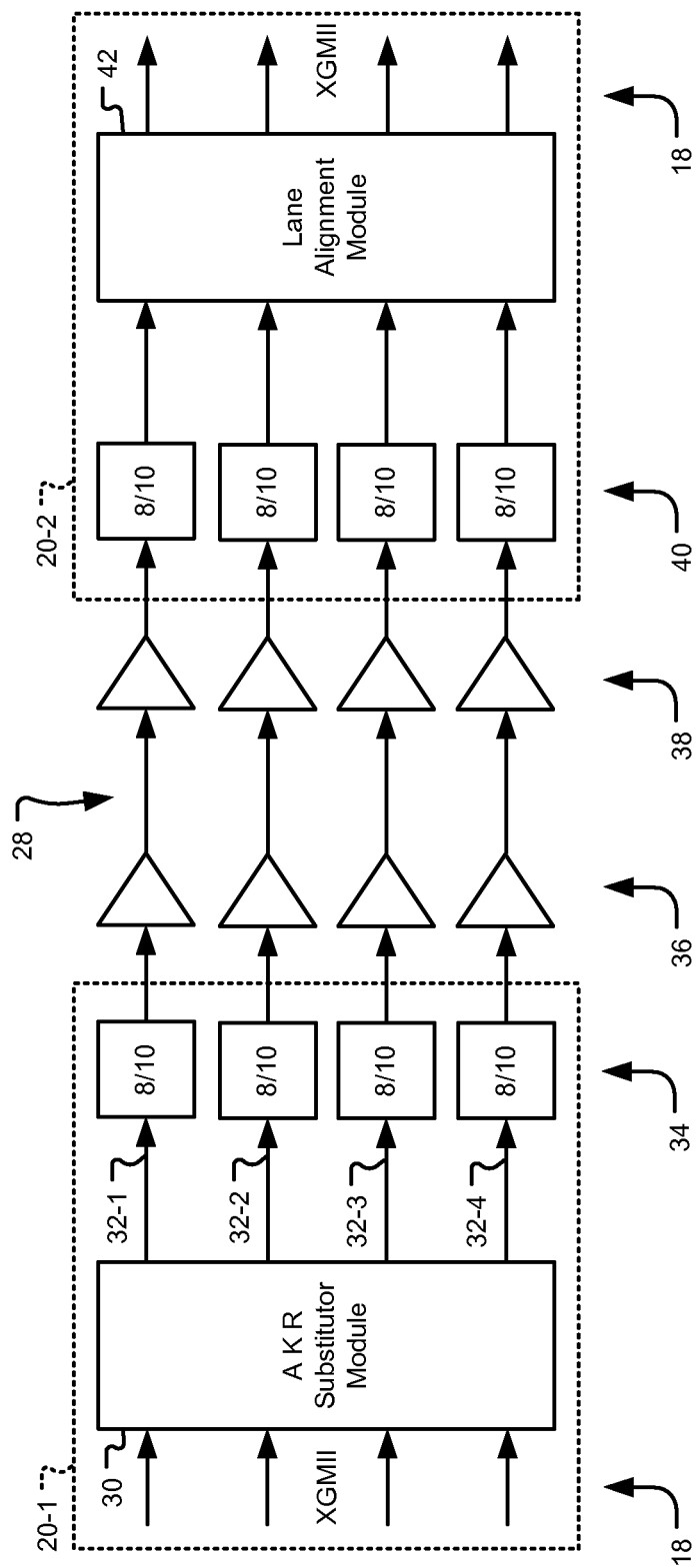
FIG. 2 is a functional block diagram of 10 GBASE-X transmit and receive PCS module layers according to the prior art.
Figure 3:
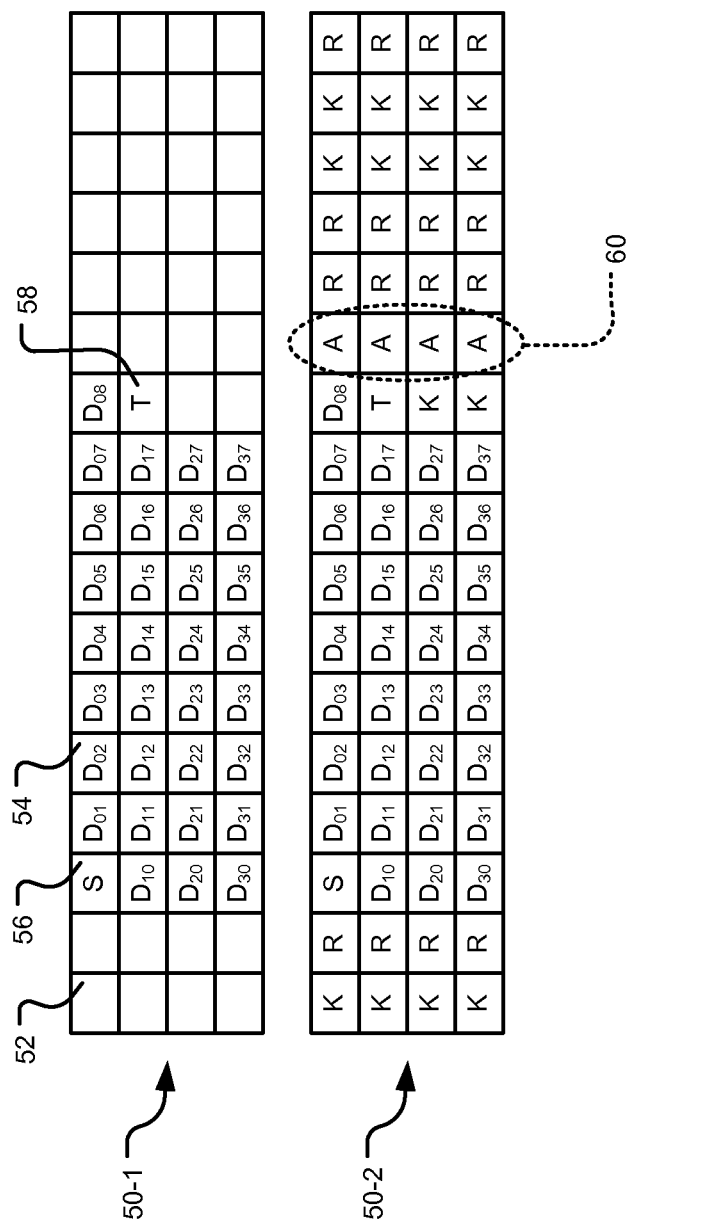
FIG. 3 is a data diagram of data and idle symbols in the transmit PCS module of FIG. 2.
Figure 4:
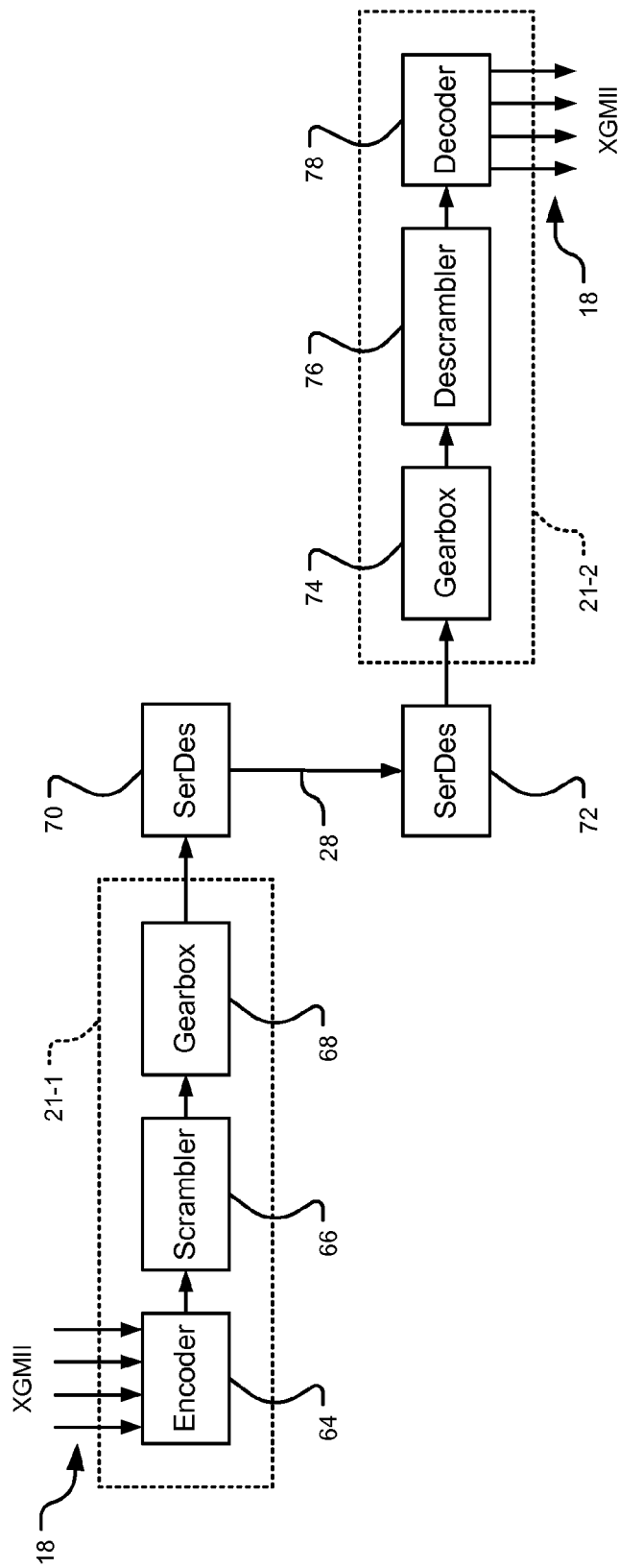
FIG. 4 is a functional block diagram of 10 GBASE-R transmit and receive PCS layers according to the prior art.
Figure 6:
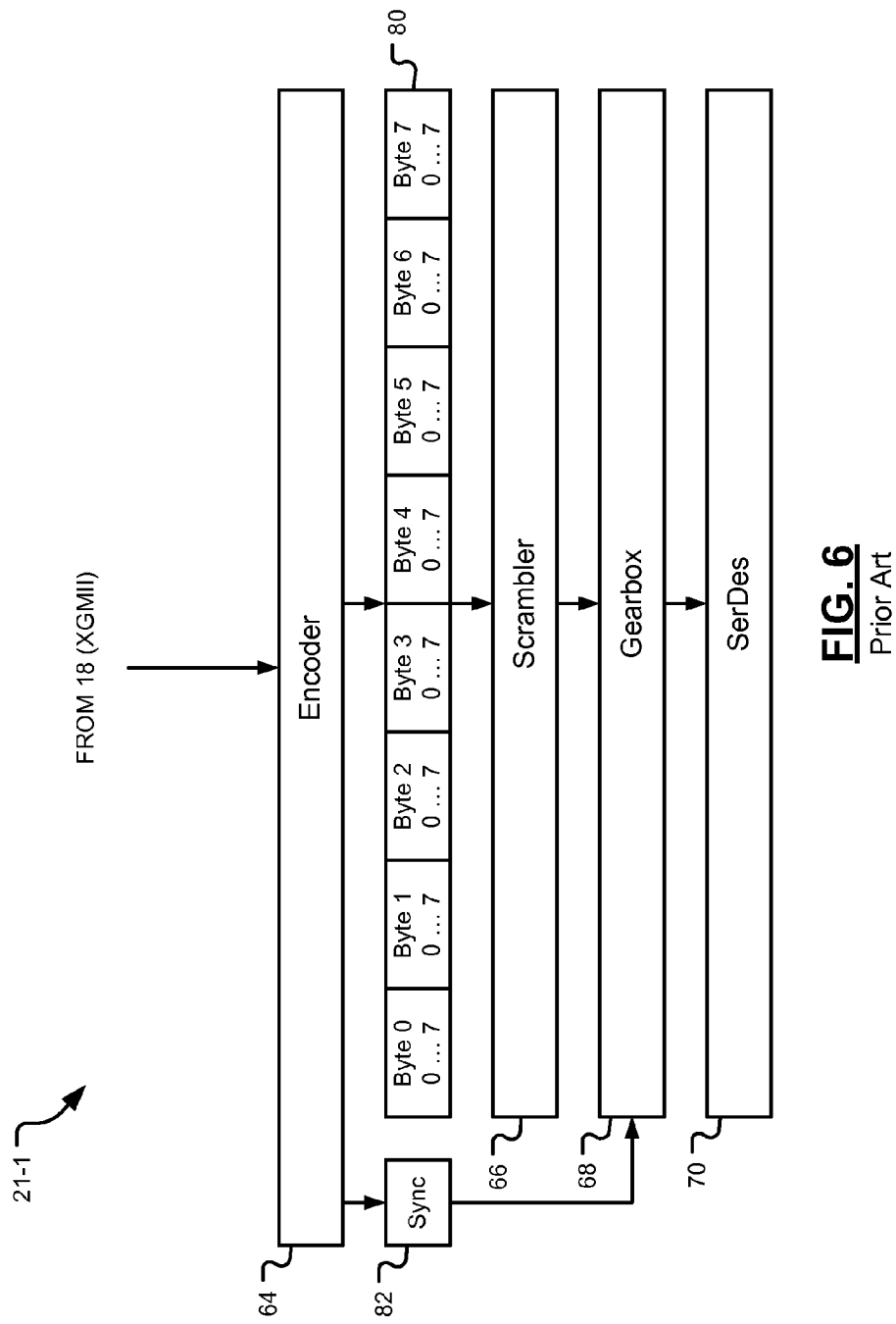
FIG. 6 is a functional block diagram of data processing within the 10 GBASE-R transmit PCS module according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, and/or a combinational logic circuit. As used herein, the phrase at least one of A, B, and C should be construed to mean a logical (A or B or C), using a non-exclusive logical or. It should be understood that steps within a method may be executed in different order without altering the principles of the present disclosure.

Figure 7:
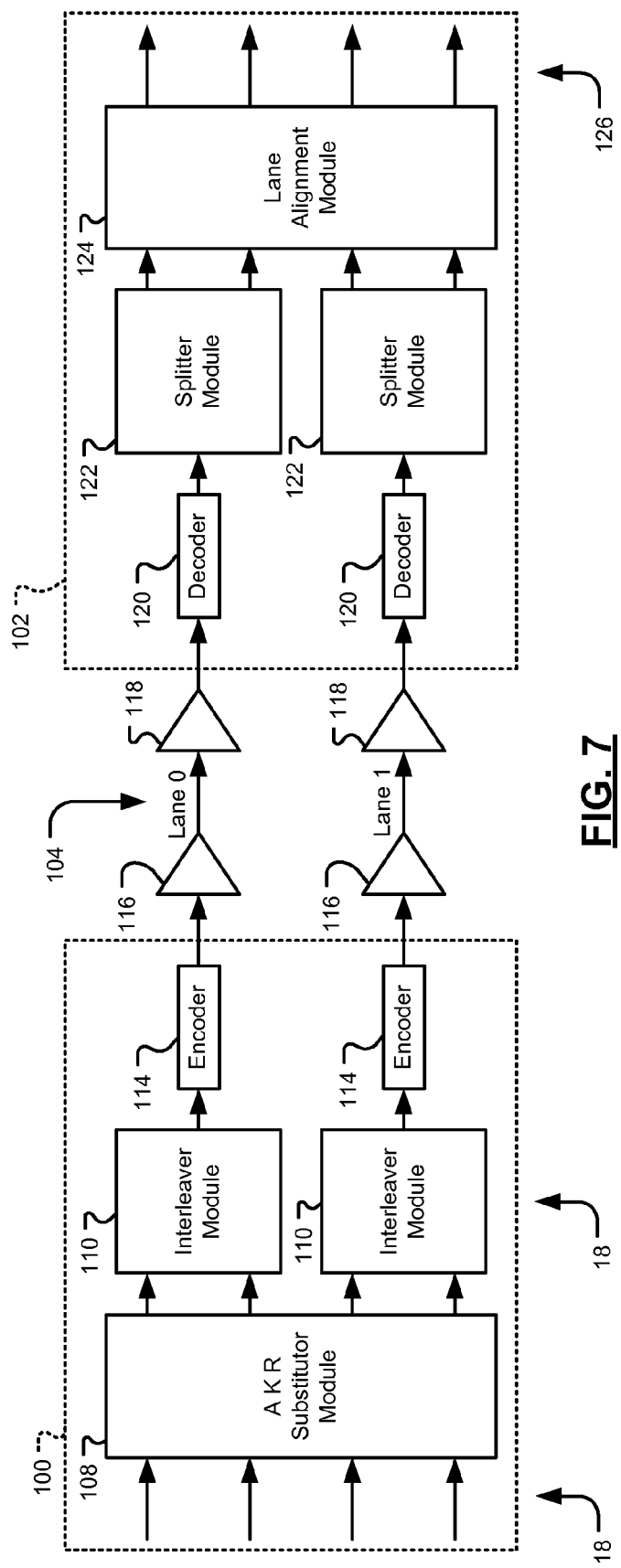
FIG. 7 is a functional block diagram of a transmit PCS module layer and a receive PCS module layer for implementing a novel 20 GBASE-X protocol.

Referring now to FIG. 7, a transmit PCS module 100 and a receive PCS module 102 are shown. Transmit PCS module 100 and receive PCS module 102 are configured to operate in a novel 20 GBASE-X mode. The 20 GBASE-X mode provides 4-lane to 2-lane aggregation that allows a physical medium 104 to propagate aggregated data through two 10 Gb lanes. Each lane employs an 8/10 encoding scheme.

Transmit PCS module 100 receives data through four input lanes 106. Input lanes 106 can include 10 GBASE-X and/or XGMII lanes. A substitutor module 108 replaces incoming idle symbols with control symbols in accordance with a method specified by IEEE 802.3 10 GBASE-X. Interleaver modules 110 each receive the data from two adjacent output lanes of substitutor module 108. Each interleaver module 110 interleaves the two lanes of data onto one of two output lanes. Encoders 114 encode data from respective lanes. Encoders 114 employ the 8/10 encoding scheme when operating in the 20 GBASE-X mode. Line drivers or amplifiers 116 drive interleaved data onto respective lanes of physical medium 104.

A receiver includes amplifiers 118 that receive the interleaved data from respective lanes of physical medium 104. Amplifiers 118 communicate the interleaved data to respective inputs of receive PCS module 102. Receive PCS module 102 includes decoders 120 that decode the interleaved data from respective inputs of PCS module 102. Decoders 120 employ an 8/10 decoding scheme. Splitter modules 122 receive the data from respective decoders 120 and deinterleave the data. A lane alignment module 124 realigns the data from splitter modules 122 and communicates the realigned data to output lanes 126. Output lanes 126 can include 10 GBASE-X and/or XGMII lanes. Lane alignment module 124 employs a method that aligns the data based on the control symbols that replaced some of the idle symbols in the blocks of interleaved data.

Referring now to FIG. 8, a data diagram shows data at various stages in transmit PCS module 100. A first data diagram 130-1 represents the four lanes of data entering substitutor module 108. A second data diagram 130-2 represents the four lanes of data entering interleaver modules 110. A third data diagram 132 represents the two lanes of aggregated data exiting interleaver modules 110. Blank fields represent idle characters. Data fields contain data bytes $D_N$ and their associated /S/ and /T/ symbols. Control symbol fields contain the /A/, /K/, and /R/ symbols. Substitutor module 108 replaces the idle characters with symbols according to the 10 GBASE-X specification. Interleaver modules 110 interleave one data byte or symbol at a time. This causes the simultaneously-generated /A/ symbols to appear as a contiguous 4-byte block 134 in the two lanes of aggregated data.

Referring now to FIG. 9, the first lane in block 134 includes two /A/ symbols from lanes 0 and 1, respectively. The second lane in block 134 includes two /A/ symbols from lanes 2 and 3, respectively. Splitter modules 122 split data block 134 into four lanes of associated /A/ symbols, such as shown at 134 (FIG. 8). Lane alignment module 124 uses the four lanes of associated /A/ symbols to align data prior to transmitting the data onto output lanes 126.

Figure 10:
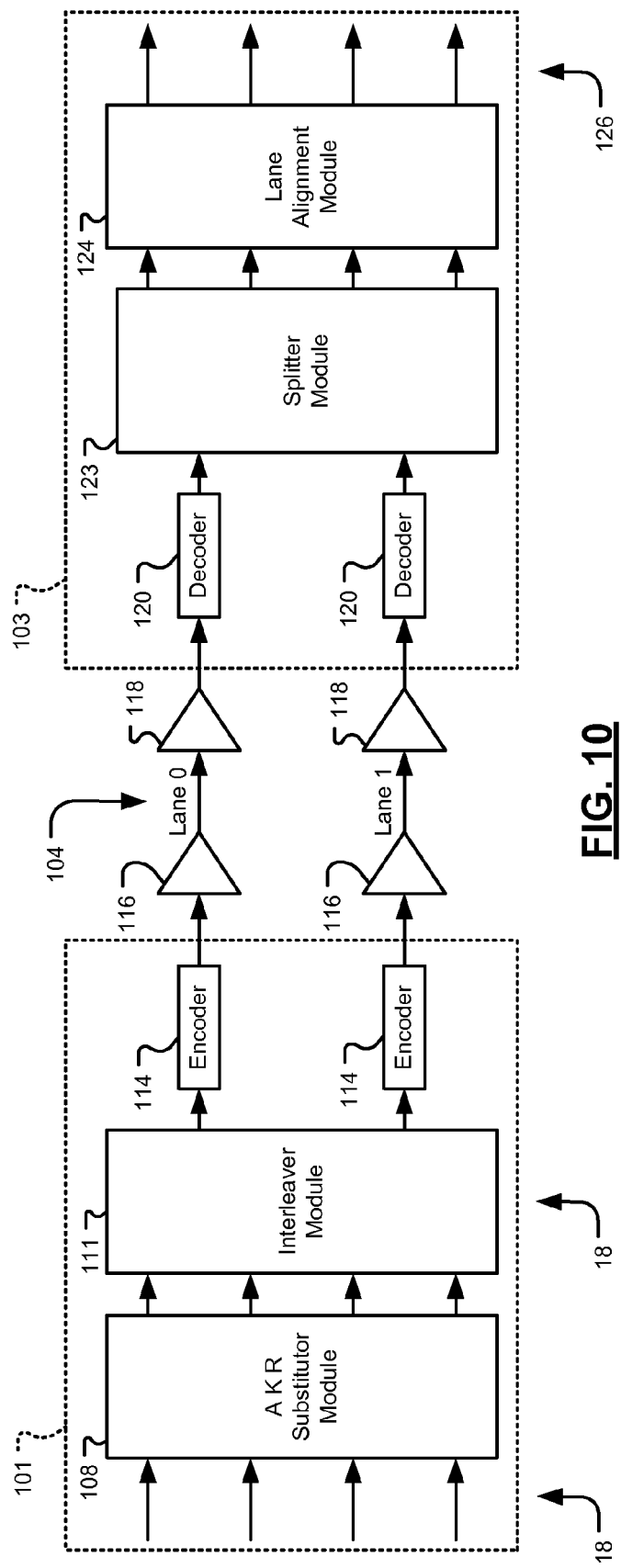
FIG. 10 is a functional block diagram of a transmit PCS module layer and a receive PCS module layer for implementing a novel 20 GBASE-R protocol.

Referring now to FIG. 10, a transmit PCS module 101 and receive PCS 103 are shown configured to implement the 20 GBASE-R mode. Substitutor module 108 employs a method shown in FIG. 11 to replace the incoming idle symbols with the /A/, /K/, /R/, and /Q/ symbols. An interleaver module 111 is configured to interleave four symbols at a time. A splitter module 123 is configured to simultaneously split data from two receive lanes into four symbols. Lane alignment module 124 realigns and communicates the data to output lanes 126. Lane alignment module 124 employs a method that aligns the data based on the symbols in the blocks of interleaved data.

Figure 11:
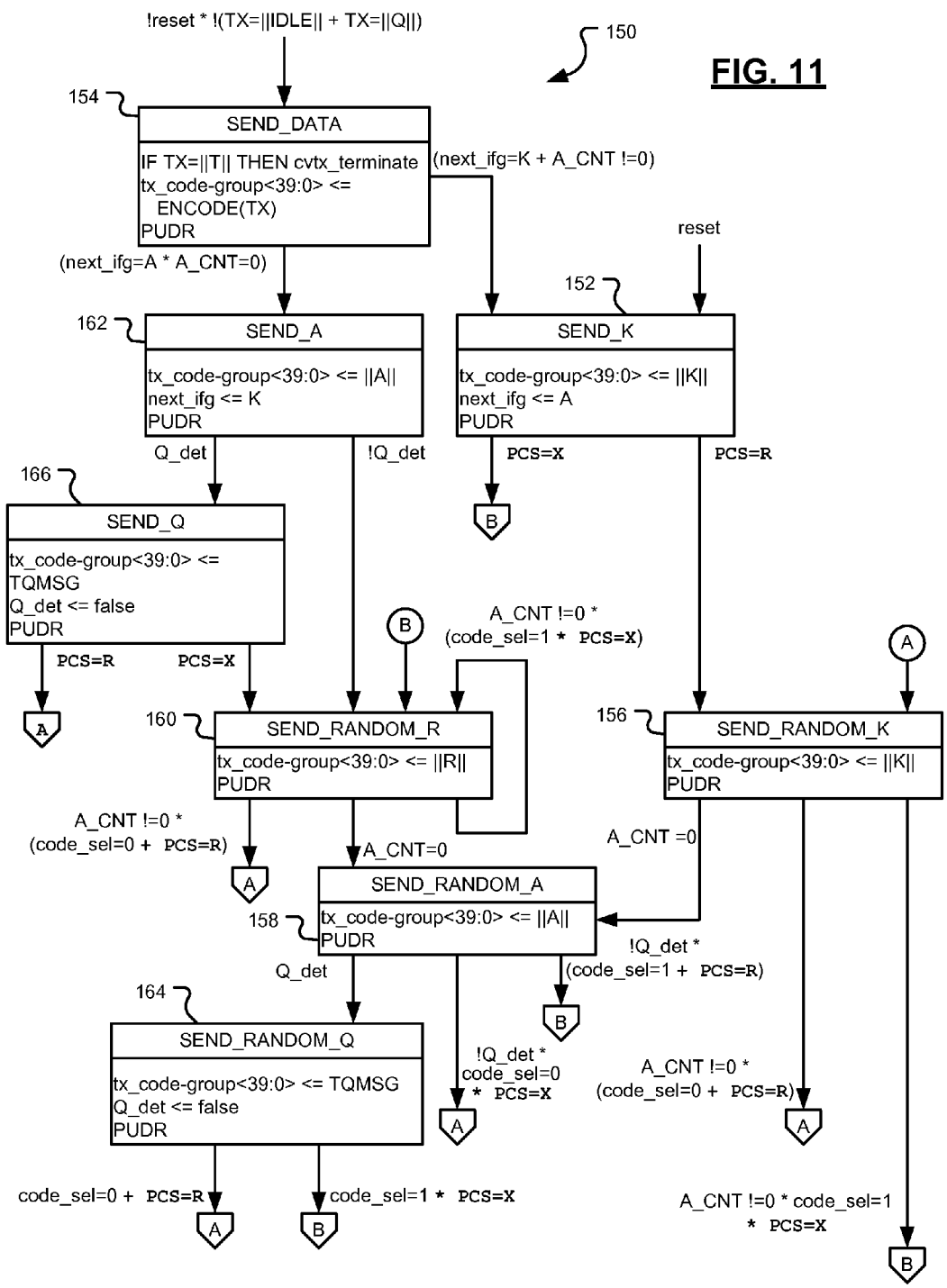
FIG. 11 is a state diagram of a substitutor module.

Referring now to FIG. 11, a method 150 is shown for replacing the idle symbols with the /A/, /K/, /R/, and /Q/ symbols. Method 150 includes a character variable "PCS". PCS is set equal to "X" when operating in the 20 GBASE-X mode and set equal to "R" when operating in the 20G BASE-R mode. When PCS=X, method 150 operates as described by the IEEE 10 GBASE-X standard. When PCS=R, method 150 operates as described below.

In general, while PCS=R, method 150 generates an /R/ or /Q/ symbol after an /A/ symbol. The /R/ and /Q/ symbols are then used as marker symbols to identify an alignment group. Also, while PCS=R, all /R/ symbols that would otherwise be followed by a /K/ symbol under 10 GBASE-X are instead sent as a single /K/ symbol. Method 150 includes a number of states that are executed by substitutor module 108. Control changes from one state to another each time a symbol is clocked into substitutor module 108.

Control can enter through one of two points. The first entry point is a SEND_K state 152. Control enters the SEND_K state 152 after a reset condition. The second entry point is a SEND_DATA state 154. Control enters the SEND_DATA state 154 when the reset condition is not present and neither an idle symbol nor a /Q/ symbol arrives at the inputs of substitutor module 108.

From reset, control immediately enters SEND_K state 152. In the SEND_K state 152 control generates a /K/ symbol on each output of substitutor module 108. Control then proceeds to a SEND_RANDOM_K state 156 and generates a /K/ symbol on each output of substitutor module 108. If a pseudo-random integer A_CNT is equal to zero then control proceeds to a SEND_RANDOM_A state 158 and generates an /A/ symbol on each output of substitutor module 108. If A_CNT≠0 in SEND_RANDOM_K state 156, then control reenters the SEND_RANDOM_K state 156. From SEND_RANDOM_A state 158 control proceeds to a SEND_RANDOM_R state 160 provided substitutor module 108 has not received a /Q/ symbol. From SEND_RANDOM_R state 160 control returns to the SEND_RANDOM_K state 156 or, if A_CNT=0, to the SEND_RANDOM_A state 158.

When the reset condition is not present and substitutor module 108 receives neither an idle symbol nor a /Q/ symbol then control enters the SEND_DATA state 154. From SEND_DATA state 154 control proceeds to the SEND_K state 152 or, if ACNT=0, to a SEND_A state 162. From the SEND_A state 162 control proceeds to the SEND_RANDOM_R state 160 unless substitutor module 108 received a /Q/ symbol.

When control is in the SEND_RANDOM_A state 158 and substitutor module 108 receives a /Q/ symbol, then control proceeds to a SEND_RANDOM_Q state 164. The SEND_RANDOM_Q state 164 generates a /Q/ symbol at the outputs of substitutor module 108. Control then proceeds to the SEND_RANDOM_K state 156.

When control is in the SEND_A state 162 and substitutor module 108 receives a /Q/ symbol, then control proceeds to a SEND_Q state 166. The SEND_Q state 166 generates a /Q/ symbol at the outputs of substitutor module 108. Control then proceeds to the SEND_RANDOM_K state 156.

Figure 12:
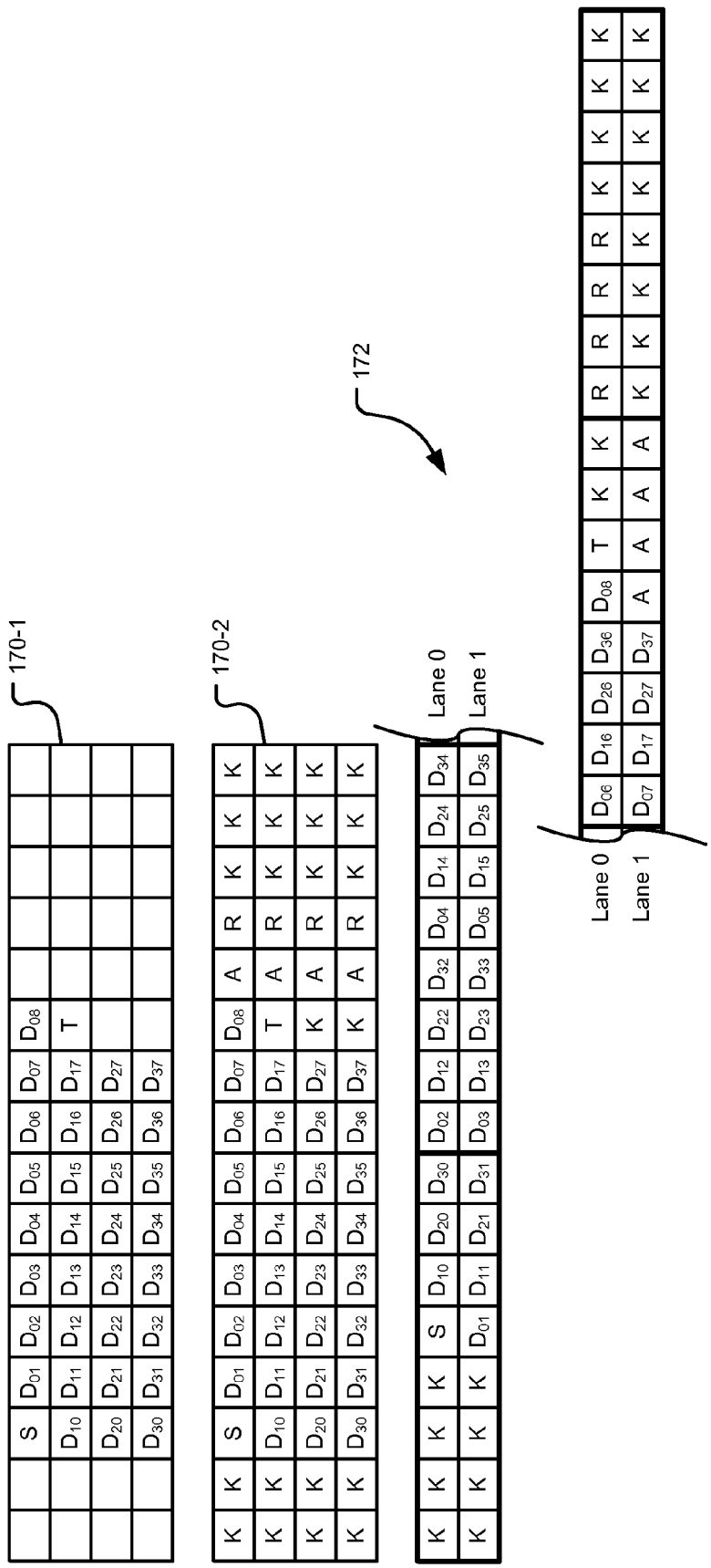
FIG. 12 is a data diagram of aggregated symbols for 20 GBASE-R communications.

Referring now to FIG. 12, a data diagram shows data at various stages in transmit PCS module 101. A first data diagram 170-1 represents the four lanes of data entering substitutor module 108. A second data diagram 170-2 represents the four lanes of data entering interleaver module 111. A third data diagram 172 represents the two lanes of aggregated data exiting interleaver module 111. Blank fields represent idle characters. Data fields contain data bytes $D_N$ and their associated /S/ and /T/ symbols. Control symbol fields contain the /A/, /K/, and /R/ symbols. Substitutor module 108 replaces the idle symbols with control symbols according to method 150 (FIG. 11). Interleaver module 111 interleaves four symbols at a time. This causes each column from second data diagram 170-2 to appear as a row of four contiguous symbols in data diagram 172.

Figures 13, 14:
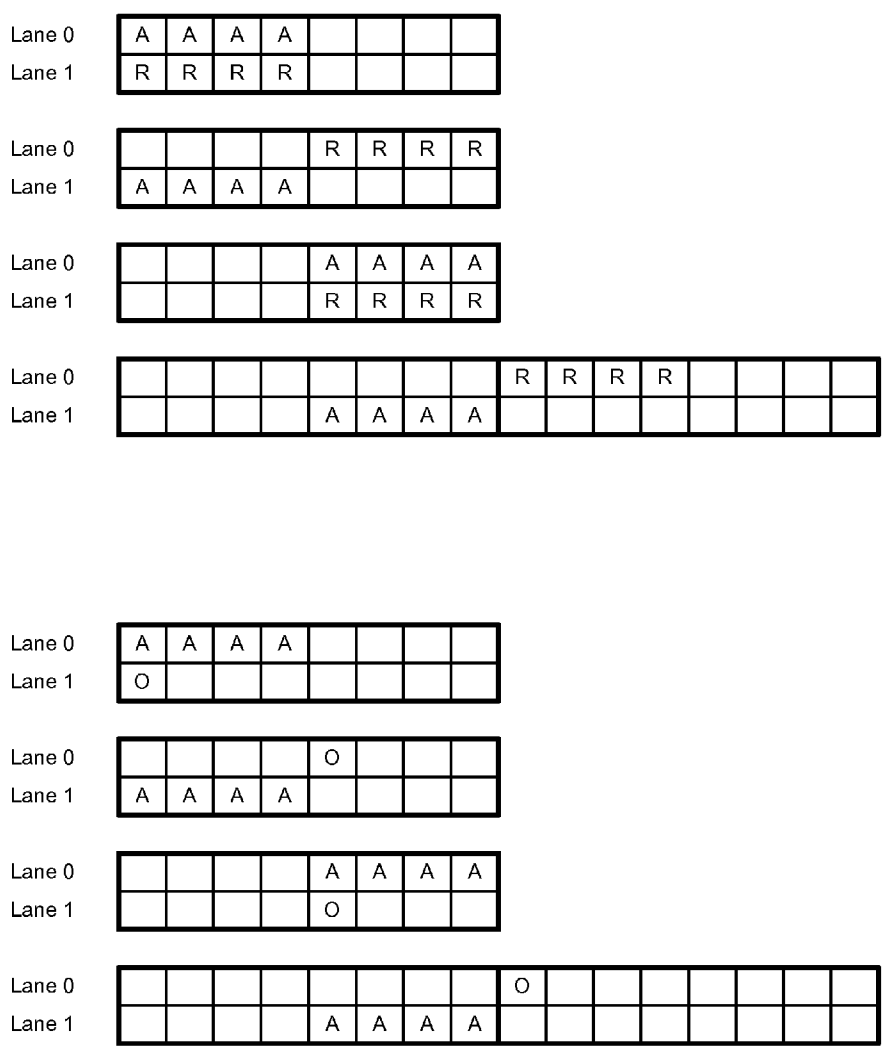

Referring now to FIGS. 13 and 14, data diagrams show valid combinations of /A/ and /R/ symbols (FIG. 13) and /A/ and /Q/ symbols (FIG. 14) at the outputs of interleaver module 111. The simultaneously-generated /A/ symbols appear as a contiguous four-byte block 174 in one of the two lanes of aggregated data. Method 150 assures that the simultaneously-generated /A/ symbols are followed by a set of simultaneously-generated set of /R/ symbols or /Q/ symbols. A /Q/ symbol includes a sequence-ordered set of an /O/symbol followed by three data symbols. Receive PCS module 103 uses the valid combinations of /A/ together with /R/ and /Q/ symbols to realign the received data.

Referring now to FIG. 15, a chart 200 compares usage of particular control symbols for 10 GBASE-R and 20 GBASE-R. Each row includes attributes and usage for one of the control symbols. A column 202 describes the usage of each control symbol under 10 GBASE-R. A column 204 describes how the usage of each symbol changes from 10 GBASE-R to 20 GBASE-R. Chart 200 shows that the /R/ and /A/ symbols are reserved characters under 10 GBASE-R and used for alignment under 20 GBASE-R. The /K/ symbol is a reserved character under 10 GBASE-R and used for non-alignment idle under 20 GBASE-R.

Figure 16B:
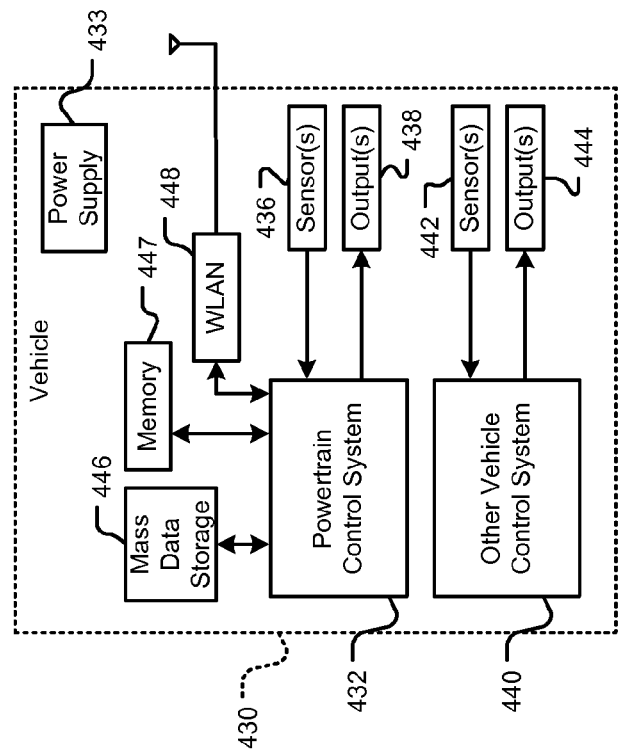
FIG. 16B is a functional block diagram of a vehicle control system.
Figure 16A:
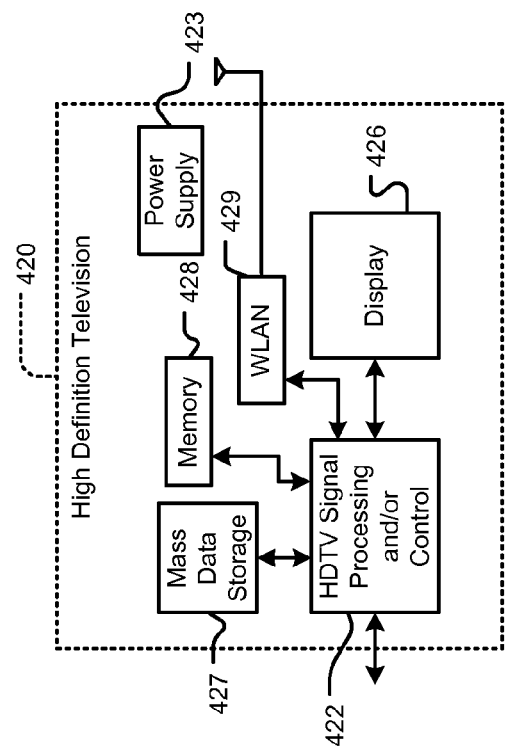
FIG. 16A is a functional block diagram of a high definition television.

Referring now to FIGS. 16A-16D, various exemplary implementations of the present invention are shown. Referring now to FIG. 16A, the present invention can be implemented in a high definition television (HDTV) 420. The present invention may implement and/or be implemented in either or both signal processing and/or control circuits, which are generally identified in FIG. 16A at 422. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. The mass data storage 427 may include at one HDD and/or at least one DVD player/recorder. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429. The HDTV 420 may also include a power supply 423.

Referring now to FIG. 16B, the present invention may implement and/or be implemented in a control system of a vehicle 430. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include at one HDD and/or at least one DVD player/recorder. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown). The vehicle 430 may include a power supply 433.

Figure 16C:
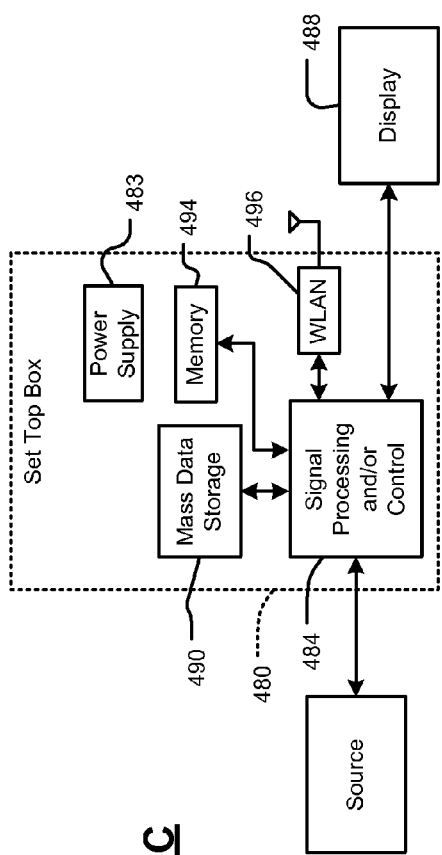
FIG. 16C is a functional block diagram of a set top box.

Referring now to FIG. 16C, the present invention can be implemented in a set top box 480. The present invention may implement and/or be implemented in either or both signal processing and/or control circuits, which are generally identified in FIG. 16C at 484. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include at one HDD and/or at least one DVD player/recorder. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496. The set top box 480 may include a power supply 483.

Figure 16D:
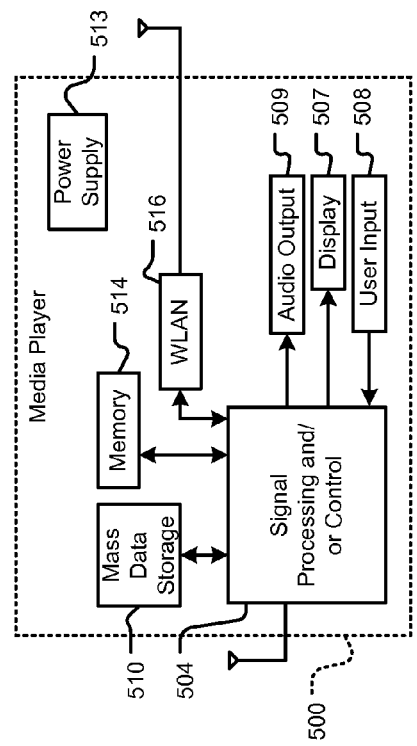
FIG. 16D is a functional block diagram of a media player.

Referring now to FIG. 16D, the present invention can be implemented in a media player 500. The present invention may implement and/or be implemented in either or both signal processing and/or control circuits, which are generally identified in FIG. 16D at 504. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage 510 may include at least one HDD and/or at least one DVD player/recorder. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. The media player 500 may also include a power supply 503. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A network interface, comprising:
an interleaver module configured to
  (i) receive symbols on a plurality of input lanes, wherein the symbols are arranged in groups, and wherein each group includes one symbol from each of the plurality of input lanes, and wherein the symbols within each group are received concurrently on the plurality of input lanes,
  (ii) serially output the symbols of a first group of the groups onto a first output lane of a plurality of output lanes,
  (iii) serially output the symbols of a second group of the groups onto a second output lane of the plurality of output lanes, and
  (iv) serially output the symbols of a third group of the groups onto the first output lane,
wherein the second group is received after the first group, and
wherein the third group is received after the second group, with no intervening groups being received between the second group and the third group; and
a plurality of line drivers configured to drive data based on the plurality of output lanes onto respective lanes of a physical medium.

2. The network interface of claim 1, further comprising a plurality of encoder modules corresponding to the plurality of output lanes, respectively, wherein each of the plurality of encoder modules is configured to encode a set of consecutive symbols from the respective output lane into an encoded symbol and output the encoded symbol to a respective one of the plurality of line drivers.

3. The network interface of claim 2, wherein each of the plurality of encoder modules is configured to encode the set of consecutive symbols using 64/66 encoding.

4. The network interface of claim 3, wherein the plurality of encoder modules are configured to encode the set of consecutive symbols using 64/66 encoding according to 10 GBase-R physical coding sublayer (PCS).

5. The network interface of claim 2, wherein each of the plurality of encoder modules is configured to encode eight consecutive symbols consisting of 64 bits into the encoded symbol consisting of 66 bits.

6. The network interface of claim 1, wherein the plurality of output lanes consists of two output lanes.

7. The network interface of claim 1, wherein the plurality of input lanes consists of four input lanes.

8. The network interface of claim 1, further comprising a substitutor module configured to selectively replace groups of symbols on the plurality of input lanes prior to the symbols being received by the interleaver module.

9. The network interface of claim 8, wherein the substitutor module is configured to, at periodic intervals, replace a group of idle symbols on the plurality of input lanes with a group of alignment symbols.

10. The network interface of claim 9, wherein the substitutor module is configured to replace a subsequent group of symbols on the plurality of input lanes with a group of disposable symbols, wherein the subsequent group of symbols is immediately after the group of alignment symbols with no intervening groups of symbols.

11. A method of operating a network interface, the method comprising:
  receiving symbols on a plurality of input lanes, wherein the symbols are arranged in groups, and wherein each group includes one symbol from each of the plurality of input lanes, and wherein the symbols within each group are received concurrently on the plurality of input lanes;
  serially outputting the symbols of a first group of the groups onto a first output lane of a plurality of output lanes;
  serially outputting the symbols of a second group of the groups onto a second output lane of the plurality of output lanes;
  serially outputting the symbols of a third group of the groups onto the first output lane, wherein
    the second group is received after the first group, and
    the third group is received after the second group, with no intervening groups being received between the second group and the third group; and
  driving data based on the plurality of output lanes onto respective lanes of a physical medium.

12. The method of claim 11, further comprising, for each of the plurality of output lanes:
  encoding a set of consecutive symbols from the respective output lane into an encoded symbol; and
  driving the data onto a respective lane of the physical medium based on the encoded symbol.

13. The method of claim 12, wherein the encoding is performed using 64/66 encoding.

14. The method of claim 13, wherein the encoding is performed using 64/66 encoding according to 10 GBase-R physical coding sublayer (PCS).

15. The method of claim 12, wherein:
the set of consecutive symbols consists of eight consecutive symbols totaling 64 bits, and
the encoded symbol consists of 66 bits.

16. The method of claim 11, wherein the plurality of output lanes consists of two output lanes.

17. The method of claim 11, wherein the plurality of input lanes consists of four input lanes.

18. The method of claim 11, further comprising replacing groups of symbols on the plurality of input lanes prior to the symbols being received.

19. The method of claim 18, wherein the replacing comprises, at periodic intervals, replacing a group of idle symbols on the plurality of input lanes with a group of alignment symbols.

20. The method of claim 19, wherein the replacing comprises replacing a subsequent group of symbols on the plurality of input lanes with a group of disposable symbols, wherein the subsequent group of symbols is immediately after the group of alignment symbols with no intervening groups of symbols.

\* \* \* \* \*